United States Patent [19]

Molyneaux et al.

[11] Patent Number: 5,757,189
[45] Date of Patent: May 26, 1998

[54] ARBITRARY PLACEMENT MULTIMODE COIL SYSTEM FOR MR IMAGING

[75] Inventors: David A. Molyneaux, Mentor; William O. Braum, Solon; James W. Kristoff, Lyndhurst, all of Ohio

[73] Assignee: Picker International, Inc., Highland Heights, Ohio

[21] Appl. No.: 757,240

[22] Filed: Nov. 27, 1996

[51] Int. Cl.$^6$ ................................................. G01V 3/00
[52] U.S. Cl. ................................. 324/318; 324/322
[58] Field of Search ................................. 324/318, 322, 324/314, 300, 306, 307, 309; 128/653.5

[56] References Cited

U.S. PATENT DOCUMENTS

| | | | |
|---|---|---|---|
| 4,721,913 | 1/1988 | Hyde et al. | 324/318 |
| 4,825,162 | 4/1989 | Roemer et al. | 324/318 |
| 5,153,517 | 10/1992 | Oppelt et al. | 324/322 |
| 5,198,768 | 3/1993 | Keren | 324/318 |
| 5,483,159 | 1/1996 | Van Heelsbergen | 324/318 |
| 5,510,711 | 4/1996 | Molyneaux et al. | 324/309 |
| 5,548,218 | 8/1996 | Lu | 324/318 |
| 5,578,925 | 11/1996 | Molyneaux et al. | 324/318 |
| 5,594,337 | 1/1997 | Boskamp | 324/318 |

*Primary Examiner*—Louis M. Arana
*Attorney, Agent, or Firm*—Fay, Sharpe, Beall, Fagan, Minnich & McKee

[57] ABSTRACT

A multimode radio frequency coil ($50_1$) receives resonance signals from a region of interest while allowing arbitrary placement of the coil. A peripheral electrical conductor (62) is divided into four symmetric segments by capacitors (76), (78), (80), (82). A pair of crossing conductors (64, 66) are connected between 90° offset diagonally opposite portions of the peripheral loop (62). The crossing conductors include capacitors (68, 70) when not connected and include capacitors (68, 70, 86, 88) when connected at their midpoints. With this configuration, the coil supports orthogonal modes (72, 74) within the plane of the coil and, additionally, a third orthogonal mode (84) perpendicular to the plane of the coil. To image an extended region, a plurality of coils are overlapped to minimize mutual inductance relative to a first mode. An adjustable capacitor (90) across one of the coils adjusts mutual inductance relative to the second mode. A pair of half wavelength conductors (94, 96) are connected diagonally across the coils and are interconnected by an adjustable capacitor (98) for adjusting the third mode.

21 Claims, 12 Drawing Sheets

| TERM | TYPE OF ISOLATION |
|---|---|
| (74,72), (72,84), (74,84) | ORTHOGONAL |
| $(72(50_1), 74(50_2))$, $(74(50_1), 72(50_2))$, $(74(50_1), 72(50_2))$, $(72(50_1), 74(50_2))$, | INTRINSIC |
| $(72(50_1), 84(50_2))$, $(74(50_1), 74(50_2))$, $(84(50_1), 72(50_2))$ | MINIMUM M OVERLAP |
| $(72(50_1), 72(50_2))$ | VARIABLE CAP 90 |
| $(84(50_1), 84(50_2))$ | VARIABLE CAP 98 |

Distance Between Centers Over Length

ARBITRARY PLACEMENT MULTIMODE COIL SYSTEM FOR MR IMAGING

BACKGROUND OF THE INVENTION

The present invention relates to the magnetic resonance arts. It finds particular application in improving signal-to-noise ratio ("SNR") , reducing image acquisition time, and allowing arbitrary coil and patient positioning when overlapping multimode surface coils are used in conjunction with magnetic resonance imaging ("MRI") and will be described with particular reference thereto. However, it is to be appreciated that the present application will also find application in conjunction with other magnetic resonance imaging and spectroscopy systems in which the $B_0$ primary magnetic field is orthogonal to the plane of the radio frequency coils.

Conventionally, magnetic resonance imaging procedures include disposing a patient in a substantially uniform, primary magnetic field $B_0$. Magnetic resonance is excited in dipoles which preferentially align with the $B_0$ field by transmitting radio frequency excitation signals into the examination region and receiving radio frequency magnetic resonance signals emanating from the resonating dipoles.

Most commonly, the $B_0$ field is generated along the central bore of an annular magnet assembly, i.e., the $B_0$ field aligns with the central axis of the patient. Linear and quadrature radio frequency and gradient magnetic field coils surround the bore. Both types of coils are sensitive to placement relative to the main field and must be designed to be orientation specific.

In order to examine larger regions of patients disposed in the bore of a horizontal $B_0$ field imager, surface coils consisting of a plurality of loop coils have been used. See, for example U.S. Pat. No. 4,825,162 of Roemer and Edelstein. More specifically, a series of loop coils are partially overlapped in order to examine contiguous regions. As explained mathematically by Grover in "Inductance Calculations" (1946) and summarized in the Roemer and Edelstein patent, the mutual inductance between adjacent coils is minimized when the coils are positioned by a slight overlap. Although the use of overlapped loop coils with the induction minimized enables a larger area to be examined, each coil must be linear. That is, each coil must be sensitive to only one component and not sensitive to the orthogonal component such that no quadrature detection is provided.

To achieve an optimum SNR, specific magnetic coils are used for a unique magnetic field of orientation. More specifically, the coils have only two usable polarization modes. For example, if a magnetic field $B_0$ is oriented in a y-plane, magnetization exists in an x-z plane. No sensitivity to magnetization exists in the y-plane. To measure magnetization, one of the three following techniques is used.

In the first technique, a scan is performed at one spatial position, and then a second scan is performed with the coil at a second position. The second position overlaps, but substantially covers, the first position. This first technique typically involves physically moving the coil or using a type of switchable coil.

In the second technique, several linearly polarized coils are placed in an overlapping fashion with minimal mutual inductance. The outputs to the coils are connected to receivers and A/D converters. Thus, the resultant image has an SNR of a small linearly polarized coil with the field of view of a large coil similarly polarized.

The third technique builds on the second technique. It uses small quadrature coils placed in an overlapping fashion with minimum mutual inductance. The outputs of the coils are connected to receivers and A/D converters. As in the second technique, the resultant image has an SNR of a small linearly polarized coil with the field of view of a large coil similarly polarized.

In all three of the techniques mentioned above, the coil configurations are sensitive to the main field orientation. Linear coils may be positioned in two orthogonal planes relative to the main field without risking a decrease in sensitivity. Quadrature coils may only be positioned in one orthogonal plane relative to the main field without losing sensitivity.

These and other current techniques in the art lack the ability to place coils arbitrarily relative to the main field while preserving an optimal SNR. Each of the three configurations described above may only be optimized to work in a specific imaging plane relative to the main magnetic field. The linear versions require two orthogonal configurations to maintain optimal sensitivity, while the quadrature version may only require one such configuration to achieve the same benefit.

Devices achieving three orthogonal planes of sensitivity using a single element, or multiple overlapping elements, have previously not been available. Similarly, no coil, which can be arbitrarily placed relative to the main field, is known.

The present invention provides a new and improved apparatus and method which provides improved SNR over a given field of view without limiting the placement of the coil relative to the main field.

SUMMARY OF THE INVENTION

In accordance with one aspect of the present invention, a radio frequency coil is provided. The coil receives magnetic resonance signals from an extended region of interest while allowing arbitrary placement of the coil relative to a temporally constant main magnetic field. The radio frequency coil comprises a first capacitor electrically connected at a first location on a perimeter of the coil and a second capacitor electrically connected at a second location on the perimeter of the coil. A first segment of the coil is defined to be located between the first and second capacitors. A third capacitor is electrically connected at a third location on the perimeter of the coil. A second segment of the coil is defined to be located between the second and third capacitors. A fourth capacitor is electrically connected at a fourth location on the perimeter of the coil. A third segment of the coil is defined to be located between the third and fourth capacitors and a fourth segment of the coil is defined to be located between the fourth and first capacitors. A first electrical conductor, electrically connected between mid-points of the first and third segments of the coil, has a first radio frequency output defined therealong. A second electrical conductor, electrically connected between mid-points of the second and fourth segments of the coil, has a second radio frequency output defined therealong. A fifth capacitor is electrically connected along the first electrical conductor. A sixth capacitor is electrically connected along the second electrical conductor. Leads for receiving a first component of the resonance signal are connected across the fifth capacitor. Leads for receiving a second component of the resonance signal are connected across the sixth capacitor. Leads for receiving a third component of the magnetic field are connected across opposite peripheral segments of the coil.

In accordance with a more limited aspect of the invention, the first and second electrical conductors cross and are not electrically connected to each other.

In accordance with another aspect of the invention, the first and second electrical conductors cross and are electrically connected adjacent mid-points thereof.

In accordance with another aspect of the invention, the radio frequency coil includes a seventh capacitor, electrically connected along the first electrical conductor.

In accordance with another aspect of the invention, the radio frequency coil includes an eighth capacitor, electrically connected along the second electrical conductor.

One advantage of the present invention is its ability to receive signals simultaneously with three orthogonal components. Another advantage resides in improved signal-to-noise ratios ("SNR") and reduced acquisition times, using an arbitrary coil placement and arbitrary patient placement relative to the magnetic field orientation.

Another advantage of the present invention is its ability to shape the coils arbitrarily to fit an arbitrary anatomical area of interest and preserve SNR's.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
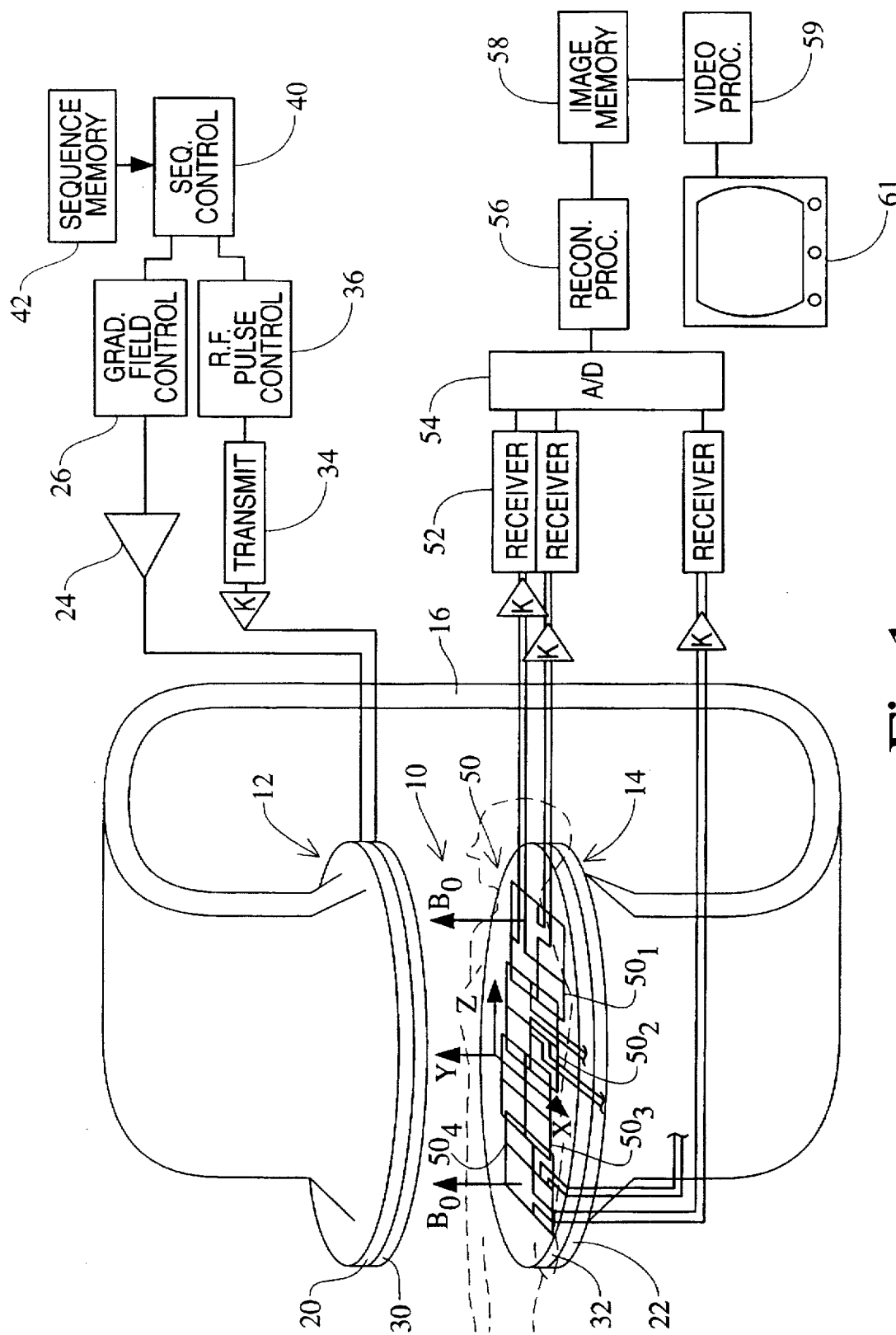
FIG. 1 is a diagrammatic illustration of a magnetic resonance system in accordance with the present invention.
Figure 2:
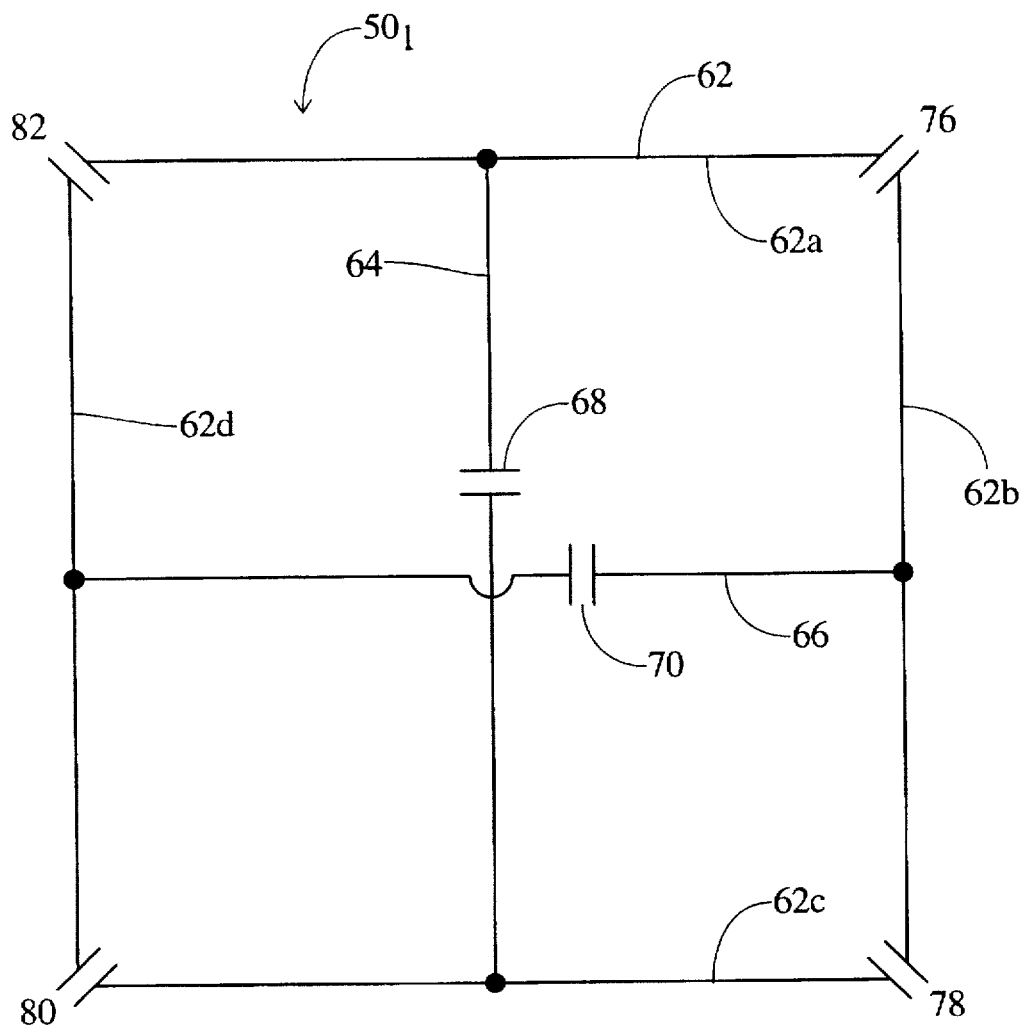
FIG. 2 is an enlarged view of a coil in the coil assembly of FIG. 1.
Figure 2:
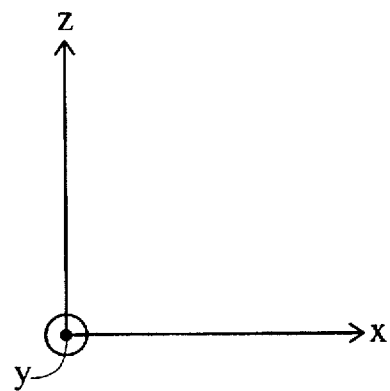
Figure 2A:
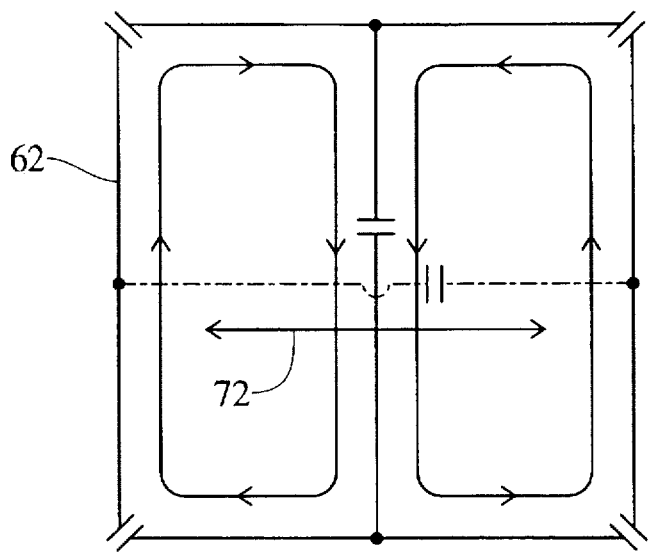
FIGS. 2A, 2B and 2C illustrate three orthogonal modes of sensitivity of the coil of FIG. 2.
Figure 2B:
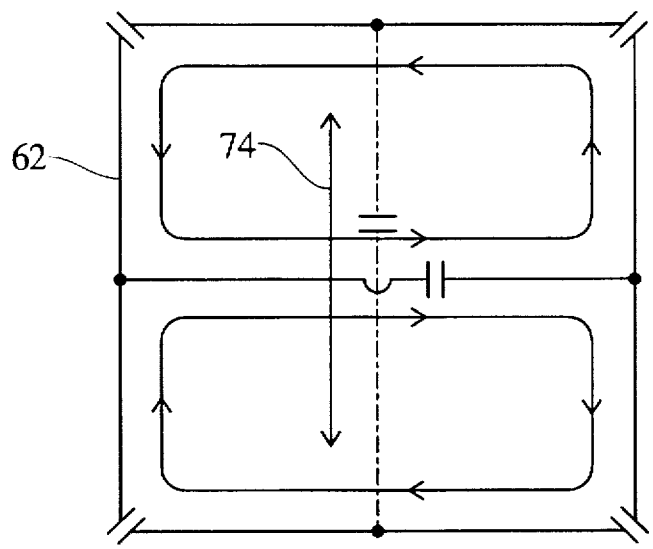
Figure 2C:
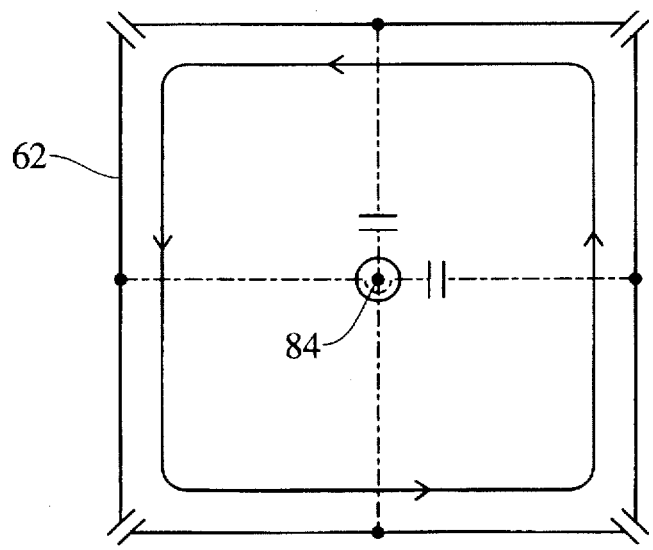

With reference to FIG. 1, an imaging region 10 is defined between pole pieces 12, 14. The pole pieces are interconnected by a ferrous flux path 16, such as a C or U-shaped iron element. Superconducting electrical windings (not shown) extend around the flux path 16 for inducing the magnetic flux in the ferrous flux path 16 and the $B_0$ field across the pole faces. Passive or active shims are disposed at the pole pieces or in the ferrous flux path adjacent the pole pieces to render the vertical $B_0$ field more linear across the imaging region 10.

For imaging, magnetic field gradient coils 20, 22 are disposed at the pole pieces 12, 14. In the preferred embodiment, the gradient coils are planar coil constructions which are connected by gradient amplifiers 24 to a gradient magnetic field controller 26. The gradient magnetic field controller, as is known in the art, causes current pulses which are applied to the gradient coils such that gradients in the uniform magnetic field are created along the longitudinal or z-axis, the vertical or y-axis, and the transverse or x-axis.

In order to excite magnetic resonance in dipoles of a subject disposed in the examination region 10, radio frequency coils 30, 32 are disposed between the gradient coils and the imaging region. A radio frequency transmitter 34, preferably a digital transmitter, causes the radio frequency coils to transmit radio frequency pulses requested by a radio frequency pulse controller 36 to be transmitted into the imaging region 10. A sequence controller 40, under operator control, retrieves an imaging sequence from a sequence memory 42. The sequence controller 40 provides the sequence information to the gradient controller 26 and the radio frequency pulse controller 36 such that radio frequency and gradient magnetic field pulses are generated in accordance with the selected sequence.

A radio frequency surface coil assembly 50 is disposed along a region of interest of the subject. Typically, the radio frequency coils 30, 32 are general purpose coils and are built-in. On the other hand, specialty surface coils are removable for greater flexibility. However, the surface coil 50 and the below-described alternate embodiments can be the only radio frequency coils in the system. In the embodiment of FIG. 1, the surface coil assembly 50 is an elongated spine coil that is disposed on a patient supporting surface immediately below the spinal column of a patient resting on the patient supporting surface. The surface coil assembly 50 with radio frequency receivers 52 demodulates the radio frequency resonance signals received by the built-in and/or removable radio frequency coils. The surface coil assembly 50 is an array of coils $50_1, 50_2, 50_3, 50_4$, each connected with one or more receivers 52. Signals from the receivers are digitized with an array of analog-to-digital converters 54 and processed by a reconstruction processor 56 into volumetric image representations which are stored in a volumetric image memory 58. A video processor 59, under operator control, withdraws selected image data from the volume memory and formats it into appropriate format for display on a human-readable display 61, such as a video monitor, active-matrix monitor, liquid crystal display, or the like.

Although illustrated in conjunction with a C-magnet that generates a y-directed magnetic field, it is to be appreciated that the below described radio frequency coils are equally usable in the bore of annular magnets that generate a z-directed magnetic field.

With reference to FIGS. 2, 2A, 2B and 2C, each coil of the coil array 50 includes a peripheral loop 62. In the illustrated embodiment, the peripheral loop 62 is square and is defined by four linear conductors 62a, 62b, 62c, and 62d. A pair of electrical connectors 64, 66 interconnect opposite points on the loop. More specifically, the conductor 64 connects 180° opposite points of the peripheral loop 62; and, the conductor 66 connects a second pair of 180° opposite points on the peripheral loop 62. The second pair of 180° opposite points are offset by 90° from the first pair of oppositely disposed points. In the preferred square embodiment, the conductor 64 connects mid-points of conductor segments 62a and 62c; and the conductor 64 connects mid-points of the conductor segments 62b, 62d.

A capacitor or capacitive coupling 68 is connected in the first conductor 64 and a capacitor or capacitive coupling 70 is disposed in the electrical connector 66. These two capacitors enable the coil to support a first mode (FIG. 2A), which is sensitive to a magnetization component 72 in the z-direction and a second mode (FIG. 2B) which are primarily sensitive to magnetization components 74 in the x-direction of FIG. 1. Each quadrant of the outer loop 62 is broken by one of capacitors 76, 78, 80, and 82. These capacitors enable the coil to support a third mode (FIG. 2C) which is primarily sensitive to a magnetization 84 along the y-axis. In this manner, the coil is sensitive to the three mutually orthogonal modes.

When the coil $50_1$ is oriented to lie in the x-z plane and a z-directed magnetic field is applied, modes 74, 84 have maximum sensitivity and mode 72 has minimum sensitivity. This will also be true if coil $50_1$ is turned 90° to lie in the z-y plane, another 90° to lie in the x-z plane, and another 90° to lie in the z-y plane. When coil $50_1$ is rotated clockwise within each plane in each of these orientations, the modes 72, 74 will alternate in sensitivity. However, the quadrature gain remains. When the coil is tipped such that it is not parallel to the z-axis, the mode 72 increases, reaching a maximum with the coil perpendicular to the z-axis.

When a magnetic field is applied in the y-direction with the coil $50_1$ lying in the x-z plane, the modes 72, 74 have maximum sensitivity and mode 84 has minimum sensitivity. When the coil $50_1$ is then rotated in the plane clockwise 90°, modes 72, 74 have maximum sensitivity and mode 84 has minimum sensitivity. Because of the three-modes of sensitivity, the coil $50_1$ achieves quadrature gain at any arbitrary angle of orientation relative to the main field.

Figure 3:
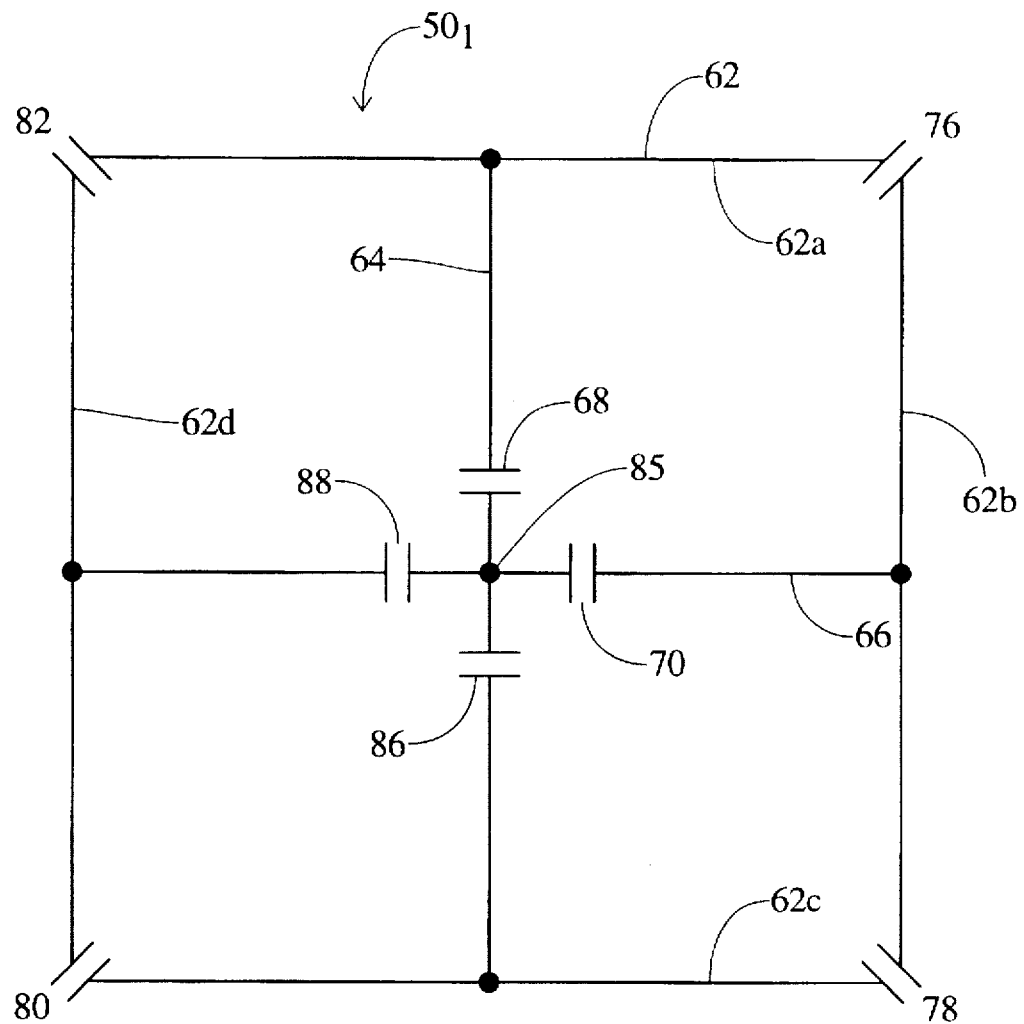
FIG. 3 is an enlarged view of a second embodiment of a coil in the coil assembly of FIG. 1.
Figure 3:
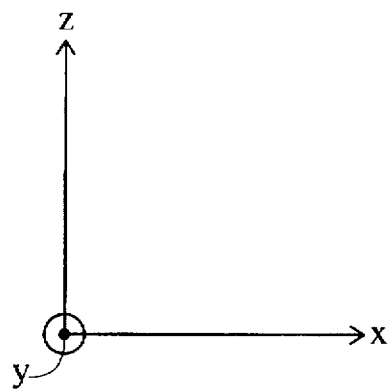

With reference to FIG. 3, in a second embodiment, the connectors 64, 66 are electrically connected to one another at their mid-points 85. Additional capacitors 86, 88 are added to the connectors 64, 66 to provide a capacitive coupling between the midpoint 85 and each interconnection with the peripheral conductor 62. Connecting the conductors 64, 66 at their mid-points improves stability.

Figure 4:
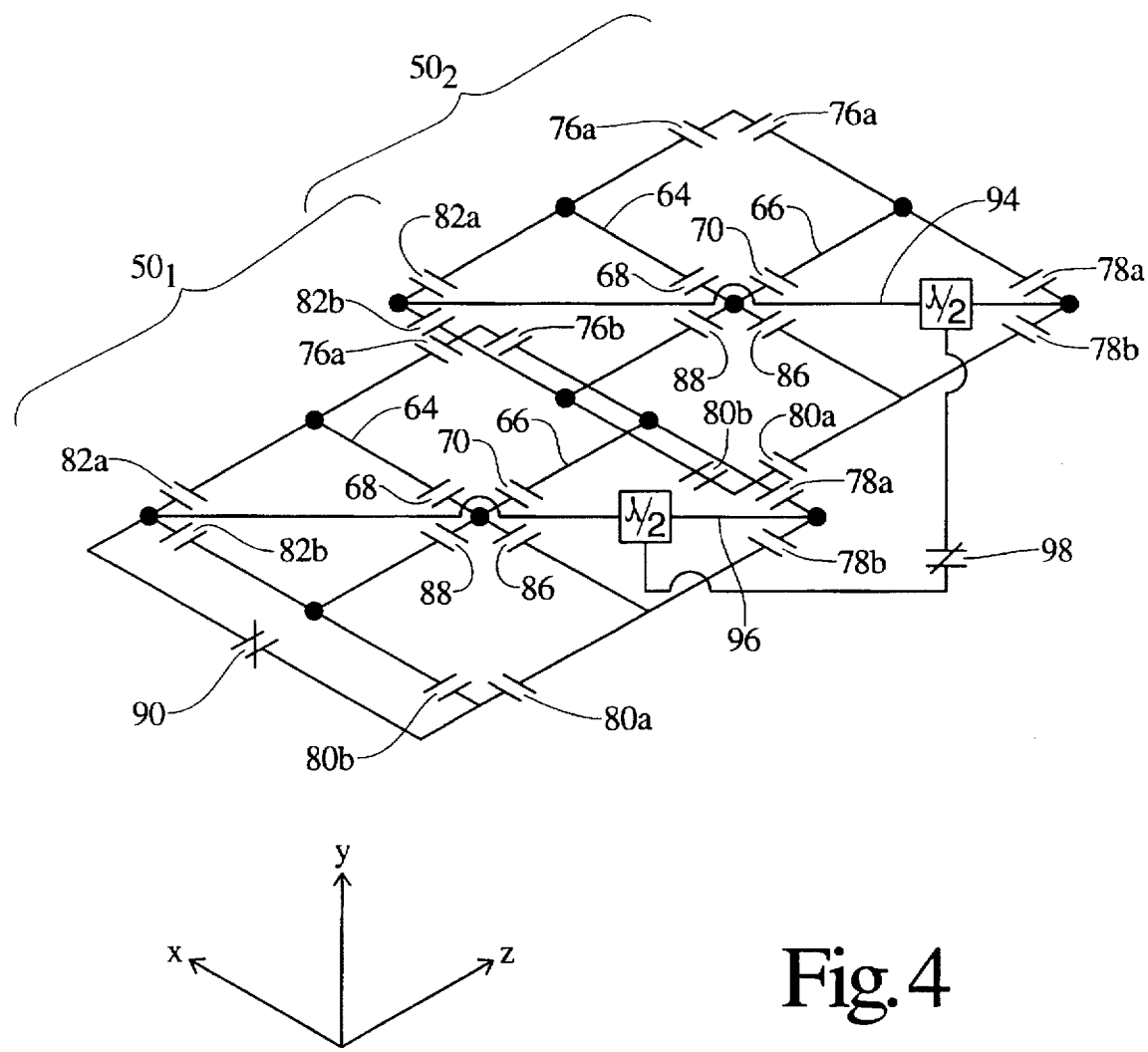
FIG. 4 is an array of two coils.

With reference to FIG. 4, when two of the coils $50_1$, $50_2$ are arranged in an array, they are partially overlapped. The degree of overlap in the z-direction (in the illustrated orientation) is adjusted to minimize the mutual inductance relative to mode 72. An adjustable tuning capacitor 90 is added to adjust mutual inductance relative to mode 74. A pair of half wavelength conductors 94, 96 are connected across diagonally opposite corners of each of coils $50_1$ and $50_2$. The half wavelength conductors are connected by an adjustable tuning capacitor 98 for adjusting mutual inductance relative to mode 84. To facilitate interconnection of the half wavelength conductors 94, 96 while maintaining symmetry, each of capacitors or capacitive couplings 76, 78, 80, and 82 are divided into a balanced pair of capacitors or capacitive couplings 76a, 76b; 78a, 78b; 80a, 80b; and 82a, 82b.

Figure 7:
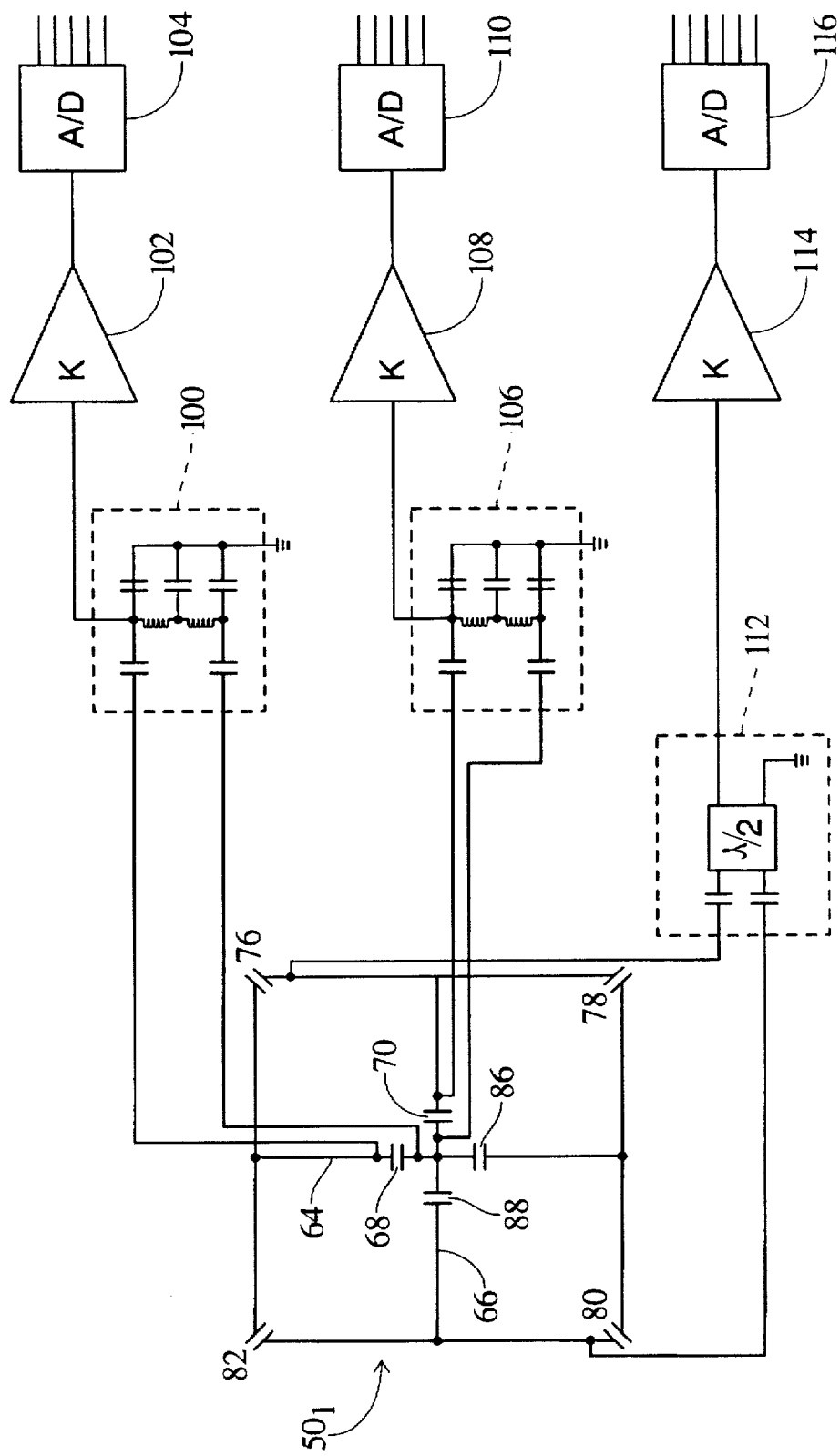
FIG. 7 illustrates a schematic representation of one method to interface a coil to an NMR system.

With reference to FIG. 7, each of the three orthogonal modes are preferably sampled separately to provide three discrete signal components. More specifically, the mode 72 is sampled by a pair of leads connected across the capacitor 68 (or 86) and connected with a matching and tuning circuit 100. The output signals are amplified by an amplifier 102 and, preferably, digitized by an analogue digital converter 104 to provide a digital output of mode 72. Analogously, a pair of leads are connected across capacitor 70 (or 88) to sample mode 74. The sampled signal is adjusted by a tuning or matching circuit 106, amplified by a preamplifier 108, and digitized by an analog to digital converter 110. Analogously, a pair of conductors are connected with diagonally opposite points of the outer loop 62 to sample the mode 84. As illustrated in FIG. 4, capacitors 76 and 78 may be split into a pair of matched capacitors and the sampling leads connected therebetween. The leads are connected with a tuning and matching circuit 112 which includes a half wavelength section to compensate for the half wavelength difference encountered between the sampling points for the mode 84. The output signals are boosted by a preamplifier 114 and digitized by an analog digital converter 116. Preferably, each of the three digital output signals are conveyed to a different digital receiver 52 for demodulation.

Figures 5, 6:
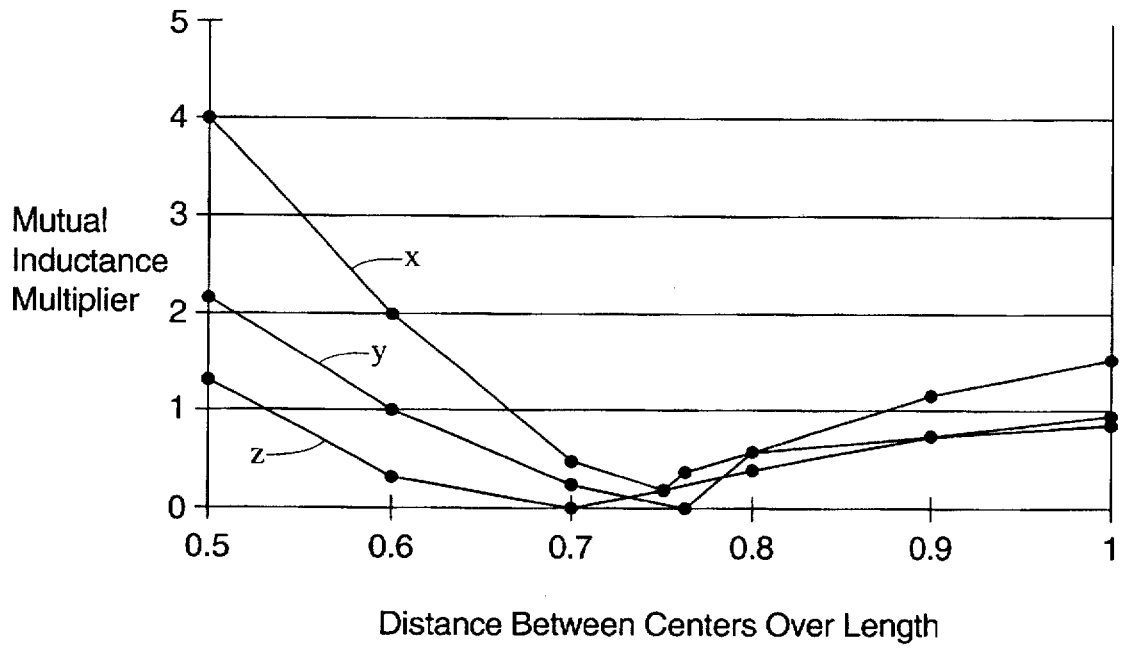
FIG. 5 is a chart summarizing the isolation techniques between the various modes of operation for the array of coils shown in FIG. 4.
FIG. 6 is a graph illustrating a typical mutual inductance between the primary modes for the coils in the array of FIG. 4.

FIG. 5 summarizes the isolation techniques between the various modes of operation.

Instead of using the isolation techniques described above (spatial position, variable capacitors, etc.), it is to be understood that other forms of isolation techniques may also be used. For example, extra loops may be added to the coil $50_1$ to cancel the presence of certain modes of the coil $50_2$. These alternative isolation techniques exist and may be identified or practiced by those skilled in the art. FIG. 6 illustrates typical mutual inductance between the primary x, y and z modes 74, 84, and 72 of coils $50_1$, $50_2$.

Figure 8:
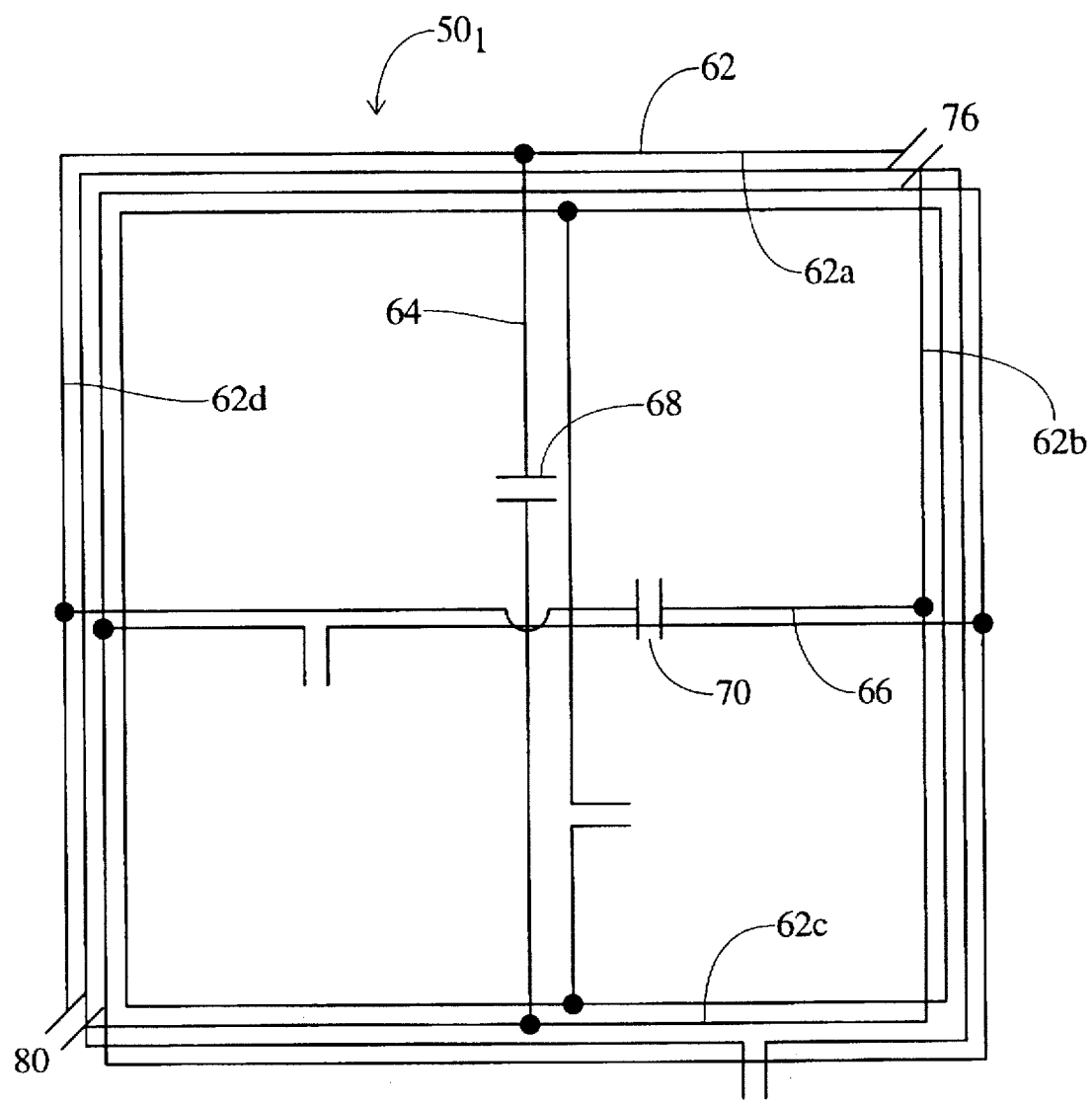
FIG. 8 illustrates capacitive coupling for the three modes.
Figure 8:
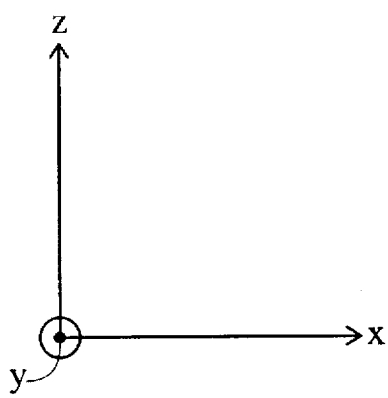

FIG. 8 illustrates the coil $50_1$ including inductive couplers associated with capacitors 68, 70, 76, 80. The inductive couplers transfer outputs from the capacitors 68, 70, 76, 80.

Other embodiments, which use phase shifters and combiners for combining signals prior to digitizing from each of the individual multimode coils within the array are also contemplated. In this embodiment, a single combined output signal is supplied to the receiver 52 for each coil.

Figure 9:
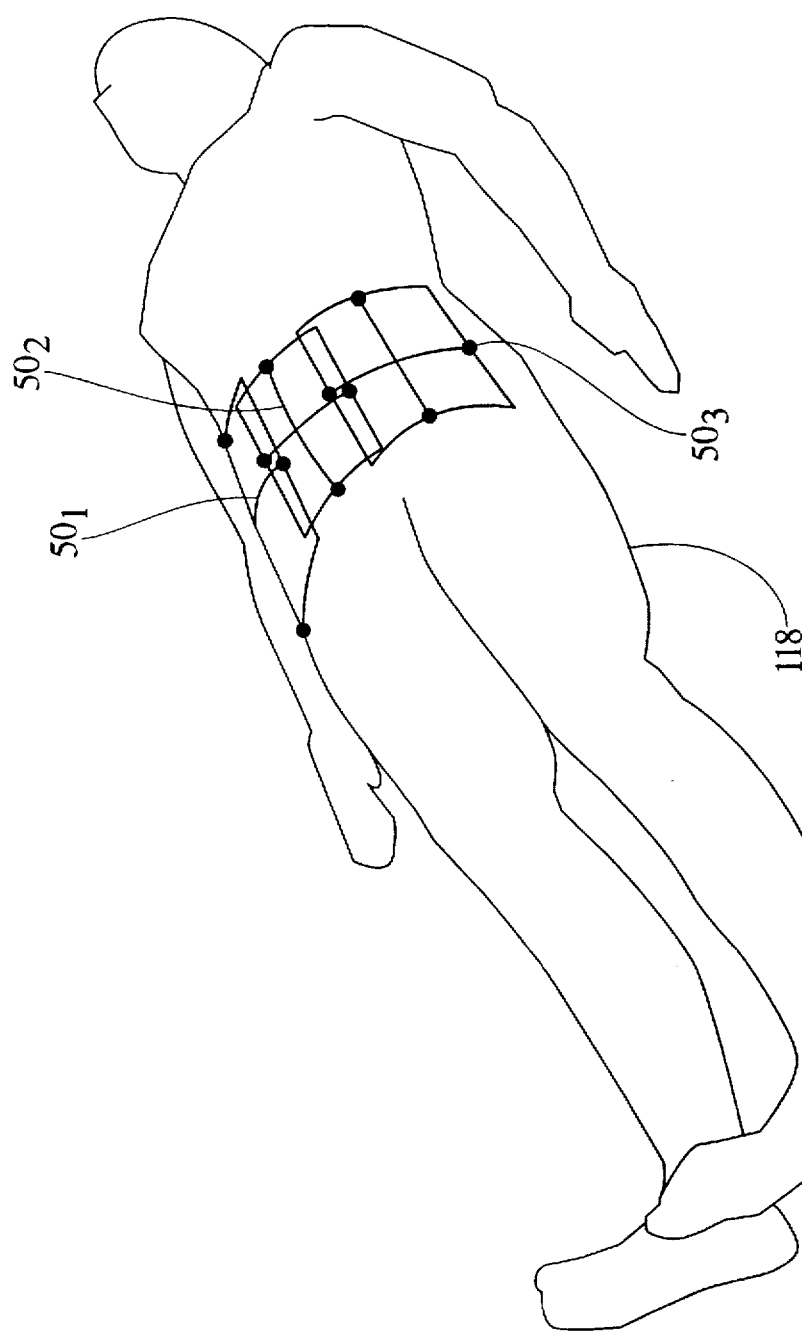
FIG. 9 illustrates an embodiment of the invention in which three flat coils are arbitrarily contoured and overlapped for imaging an abdomen of a patient.

FIG. 9 illustrates an embodiment of the invention in which three flat coils $50_1$, $50_2$, $50_3$ are arbitrarily contoured and overlapped for imaging an abdomen of a patient. The contoured flat coils $50_1$, $50_2$, $50_3$ can also image other cylindrical or elliptical body shapes, such as knees, torsos and heads, while allowing an arbitrary orientation of a patient relative to the main magnetic field.

Figure 10:
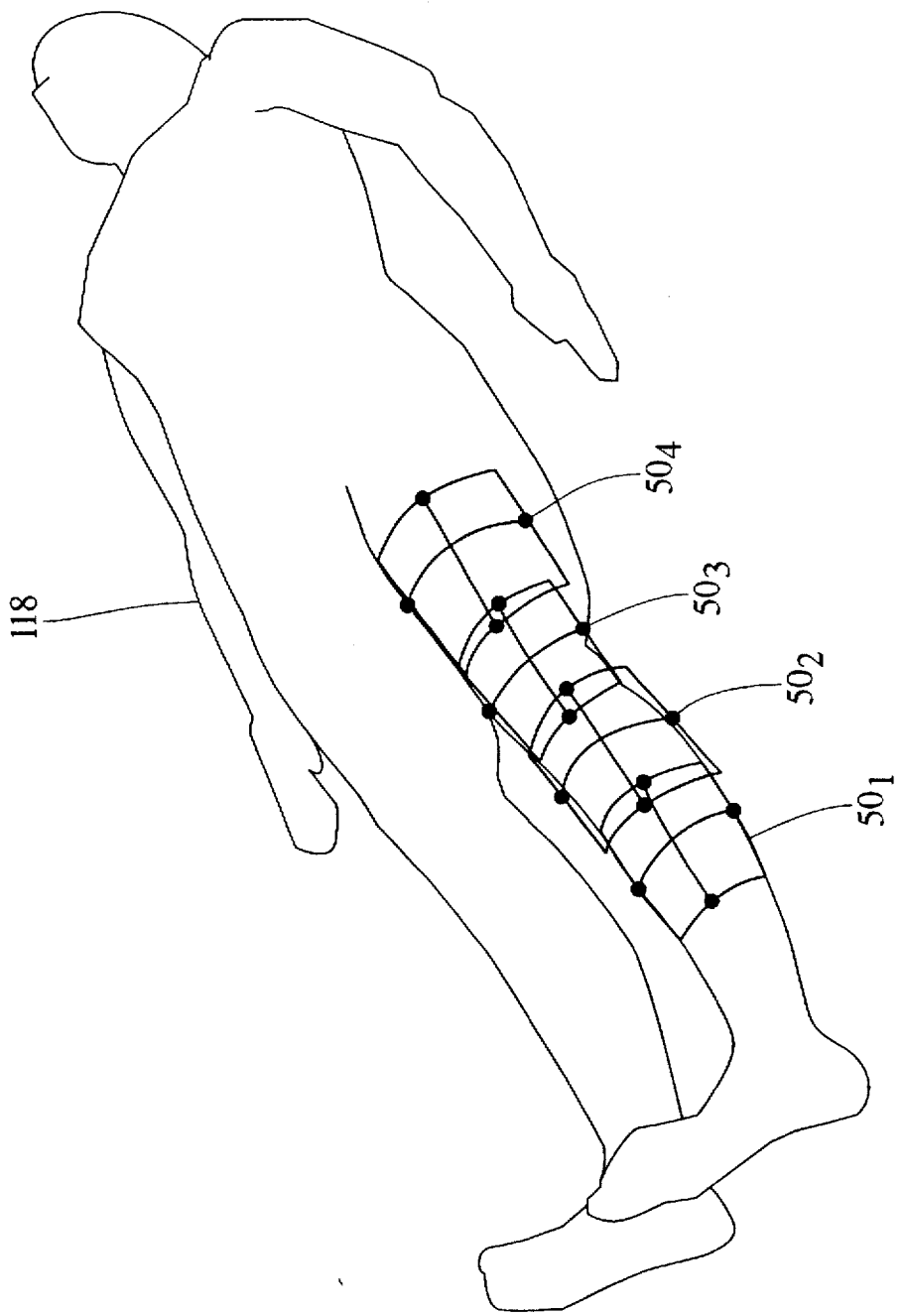
FIG. 10 illustrates another embodiment of the invention in which four curved and/or flat coils are overlapped and arbitrarily positioned on the patient for spine or leg imaging.

FIG. 10 illustrates another embodiment of the invention in which four flat coils $50_1$, $50_2$, $50_3$, $50_4$ are arranged in an array and curved to match the contour of a leg. Again, the coils can be curved and arbitrarily positioned.

Figure 11:
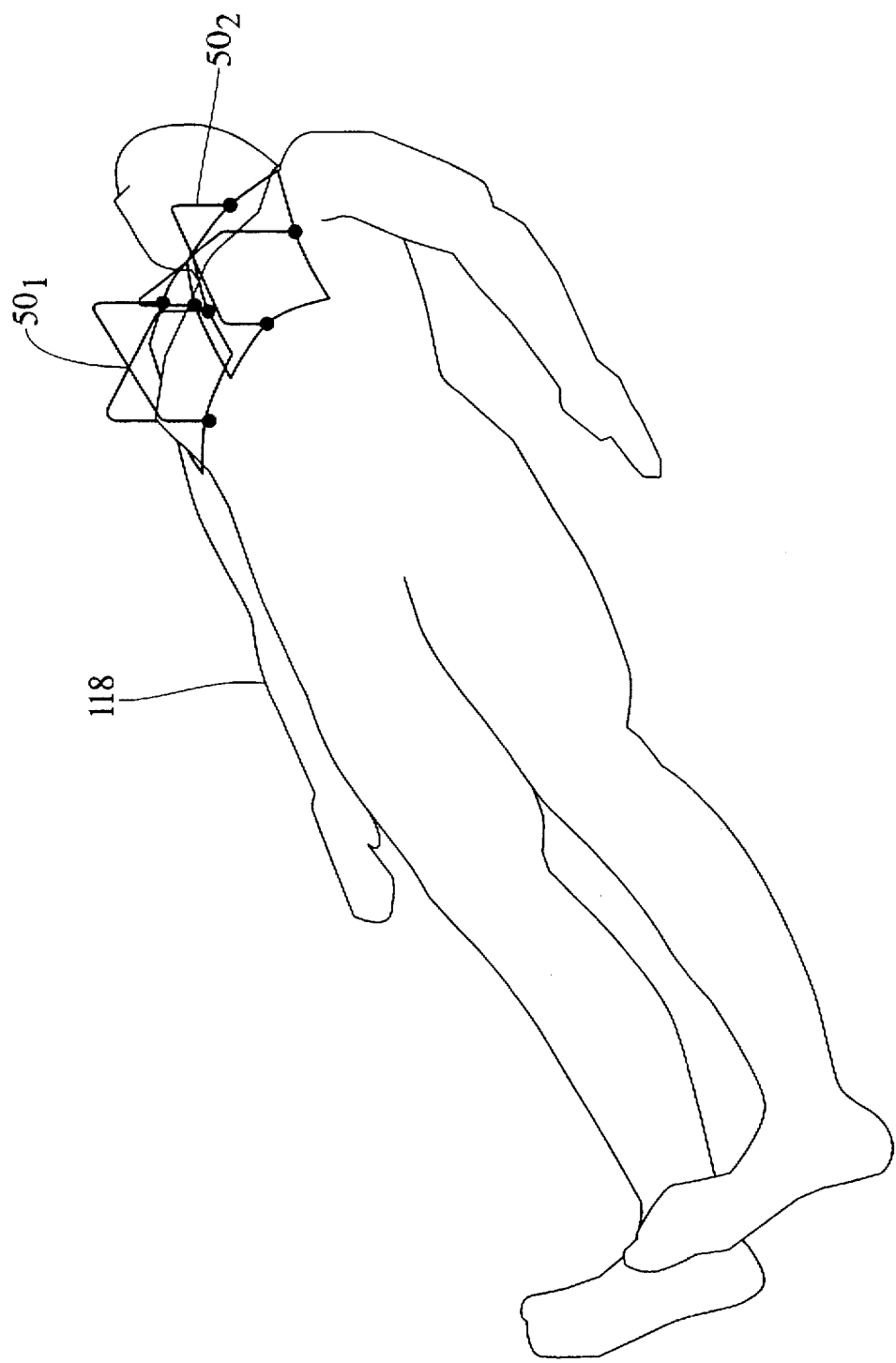
FIG. 11 illustrates another embodiment of the invention in which two cupped coils are used for imaging anatomies of a patient which fit into the coils.

FIG. 11 illustrates another embodiment in which coils $50_1$, $50_2$ are cupped to match corresponding anatomies of the patient (e.g., breasts). The cupped coils allow the patient to be positioned supine, prone, on his/her side, or other arbitrary positions during the imaging.

Figure 12:
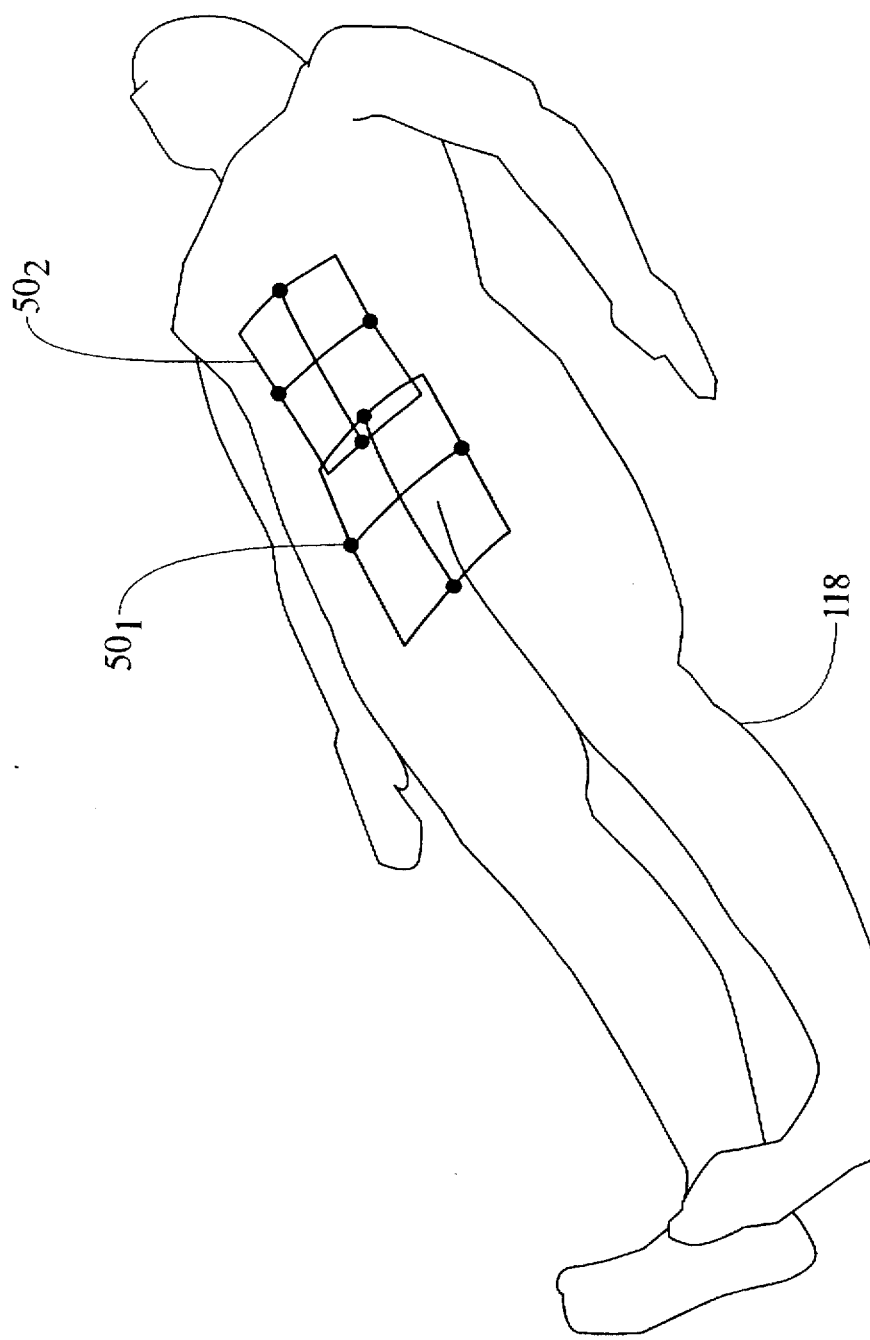
FIG. 12 illustrates another embodiment of the invention in which two multimode coils are arbitrarily contoured for surrounding a sample.

FIG. 12 illustrates another embodiment of the invention in which the multimode coils $50_1$, $50_2$ are arbitrarily contoured. More specifically, the multimode coils $50_1$, $50_2$ are contoured to fit volumes such as a pelvis, torso, or cardiac areas of a patient 118.

Embodiments which use multimode elements, constructed out of individual double D loops and butterflies, are also contemplated.

Modifying any of the above embodiments using double tuned coils, in place of any of the coils disclosed in this application, for multichannel spectroscopy imaging is also contemplated.

Using any of the above combinations as transmit/receive coils or using particular parts of the above disclosed coils as transmitters is also contemplated.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance system which includes a magnet for generating a temporally constant magnetic field through an examination region, a radio frequency transmitter for transmitting at least radio frequency magnetic resonance excitation signals, a receiver for receiving and demodulating magnetic resonance signals, and a processor connected to the receiver for processing the received and demodulated magnetic resonance signals, the improvement comprising:

- a multimode radio frequency coil which is sensitive to three mutually orthogonal components of the magnetic resonance signals, the radio frequency coil being disposed adjacent the examination region and connected with at least one of the radio frequency transmitter and receiver.

2. In the magnetic resonance system as set forth in claim 1, the multimode radio frequency coil including:

- a peripheral conductive loop;
- a first set of capacitive couplings which divide the electrically conductive loop symmetrically into at least two symmetric segments;
- a pair of crossing electrical conductors which connect oppositely disposed segments of the peripheral loop with each other; and,
- a second set of capacitive couplings within each of the crossing conductors.

3. In the magnetic resonance imaging system as set forth in claim 2, the improvement further comprising at least one of:

- a first pair of signal output leads connected with a first of the crossing conductors across one of the capacitors of the second capacitor set;
- a second pair of output leads connected with the second crossing conductor across another of the capacitors of the second capacitive set; and,
- a third output including a half wavelength conductor connected symmetrically between opposite quadrants of the peripheral electrical conductor, capacitors connected between the half wavelength conductor and the peripheral conductor, and an output lead connected to at least one side of the half wavelength conductor.

4. In the magnetic resonance imaging system as set forth in claim 2, the improvement further comprising:

inductive couplers transferring the magnetic resonance signals from at least one of the sets of capacitive couplings.

5. In the magnetic resonance imaging system as set forth in claim 2, the improvement further comprising:

direct couplers attached to at least one of the sets of capacitive couplings.

6. In the magnetic resonance imaging system as set forth in claim 1, the improvement further comprising:

- a first preamplifier and analogue digital converter connected between the first output leads and a first digital radio frequency receiver;
- a second preamplifier and analogue digital converter connected between the second output leads and a second digital receiver; and,
- a third preamplifier and analogue digital converter connected between the third output leads and a third digital receiver.

7. A magnetic resonance imaging system which includes a magnet for generating a temporally constant magnetic field through an examination region, a radio frequency transmitter for transmitting at least radio frequency magnetic resonance excitation signals, a receiver for receiving and demodulating magnetic resonance signals, and a processor connected to the receiver for processing the received and demodulated magnetic resonance signals, and further comprising:

- a multimode first radio frequency coil which supports three mutually orthogonal components of the magnetic resonance signals, the first radio frequency coil being disposed adjacent the examination region and connected with at least one of the radio frequency transmitter and receiver;
- a second radio frequency coil which supports the three mutually orthogonal components of the magnetic resonance signals and which is overlapped with the first radio frequency coil to minimize mutual inductance along a first of the three mutually orthogonal components;
- a first tuning capacitor connected with one of the radio frequency coils for selectively adjusting mutual inductance relative to a second of the three mutually orthogonal components; and,
- a pair of half wavelength conductors connected with each of the radio frequency coils and an adjustable capacitor connected between the half wavelength conductors for selectively adjusting mutual inductance relative to a third of the three mutually orthogonal components.

8. A radio frequency coil for receiving magnetic resonance signals from an extended region of interest while allowing arbitrary placement of the coil relative to a temporally constant main magnetic field, the radio frequency coil comprising:

- a first capacitor electrically connected at a first location on a perimeter of the coil;
- a second capacitor electrically connected at a second location on the perimeter of the coil, a first segment of the coil being located between the first and second capacitors;
- a third capacitor electrically connected at a third location on the perimeter of the coil, a second segment of the coil being located between the second and third capacitors;
- a fourth capacitor electrically connected at a fourth location on the perimeter of the coil, a third segment of the coil being located between the third and fourth capacitors and a fourth segment of the coil being located between the fourth and first capacitors;
- a first electrical conductor, electrically connected between mid-points of the first and third segments of the coil and having a first radio frequency output defined therealong;
- a second electrical conductor, electrically connected between mid-points of the second and fourth segments of the coil and having a second radio frequency output defined therealong;
- a fifth capacitor electrically connected along the first electrical conductor;

a sixth capacitor electrically connected along the second electrical conductor;

leads for receiving a first component of the resonance signal connected across the fifth capacitor;

leads for receiving a second component of the resonance signal connected across the sixth capacitor; and, leads for receiving a third component of the magnetic field being connected across opposite peripheral segments of the coil.

9. The radio frequency coil as set forth in claim 8 wherein the first and second electrical conductors cross and are not electrically connected to each other.

10. The radio frequency coil as set forth in claim 8 wherein the first and second electrical conductors cross and are electrically connected adjacent mid-points thereof.

11. The radio frequency coil as set forth in claim 10 further including:

a seventh capacitor, electrically connected along the first electrical conductor; and, an eighth capacitor, electrically connected along the second electrical conductor.

12. The radio frequency coil array as set forth in claim 8 wherein:

a first output mode is defined parallel to the first electrical conductor;

a second output mode is defined parallel to the second electrical conductor; and, a third output mode is defined perpendicular to the first and second modes.

13. A magnetic resonance imaging system including a main magnet for generating a temporally constant magnetic field through an examination region, gradient magnetic field coils disposed adjacent the examination region for causing gradient magnetic fields across the temporally constant magnetic field, an RF transmitter for exciting resonance in selected dipoles in the examination region such that the dipoles generate resonance signals at a characteristic resonance frequency, a multimode radio frequency coil array for receiving resonance signals from the resonating dipoles in an extended portion of the examination region arbitrarily positioned in the examination region, at least one radio frequency receiver for demodulating the resonance signals from the radio frequency coil array, and a reconstruction processor for reconstructing the demodulated radio frequency signals into an image representation, the radio frequency coil array comprising:

a first radio frequency coil having a first field of view, the first radio frequency coil being a first electrically conductive loop and including:

a first capacitor electrically connected at a first location on the first loop;

a second capacitor electrically connected at a second location on the first loop, a first segment of the first loop being located between the first and second capacitors;

a third capacitor electrically connected at a third location on the first loop, a second segment of the first loop being located between the second and third capacitors;

a fourth capacitor electrically connected at a fourth location on the first loop, a third segment of the first loop being located between the third and fourth capacitors and a fourth segment of the first loop being located between the fourth and first capacitors;

a first electrically conductive connecting element extending between mid-points of the first and third segments of the first loop and having a first radio frequency output defined therealong;

a second electrically conductive connecting element extending between mid-points of the second and fourth segments of the first loop and having a second radio frequency output defined therealong, such that the resonance signals from the first and second conductive elements are substantially 90° out-of-phase in a quadrature relationship, the first and second electrically conductive elements being connected via electrical leads with the receiver;

a fifth capacitor electrically connected along the first electrical conductor; and, a sixth capacitor electrically connected along the second electrical conductor;

the first electrical conductor being sensitive to an x-component of a magnetic field;

the second electrical conductor being sensitive to a z-component of the magnetic field; and, the first electrically conductive loop being sensitive to a y-component of the magnetic field;

a second radio frequency coil having a second field of view different from and contiguous to the first field of view, the second radio frequency coil being a second electrically conductive loop that partially overlaps the first electrically conductive loop and including:

a seventh capacitor electrically connected at a first location on the second loop;

an eighth capacitor electrically connected at a second location on the second loop, a first segment of the second loop being located between the seventh and eighth capacitors;

a ninth capacitor electrically connected at a third location on the second loop, a second segment of the second loop being located between the eighth and ninth capacitors;

a tenth capacitor electrically connected at a fourth location on the second loop, a third segment of the second loop being located between the ninth and tenth capacitors and a fourth segment of the second loop being located between the tenth and seventh capacitors;

a third electrically conductive connecting element extending between mid-points of the first and third segments of the second loop and having a third radio frequency output defined therealong;

a fourth electrically conductive connecting element extending between mid-points of the second and fourth segments of the second loop and having a fourth radio frequency output defined therealong, such that the resonance signals from the third and fourth conductive elements are substantially 90° out-of-phase in a quadrature relationship, the third and fourth electrically conductive elements being connected via electrical leads with the receiver;

an eleventh capacitor electrically connected along the third electrical conductor; and, a twelfth capacitor electrically connected along the fourth electrical conductor;

the third electrical conductor being sensitive to an x-component of a magnetic field;

the fourth electrical conductor being sensitive to a z-component of the magnetic field; and, the second electrically conductive loop being sensitive to a y-component of the magnetic field.

14. The radio frequency coil array as set forth in claim 13 wherein the first and second electrically conductive connecting elements cross perpendicular to each other but are not electrically connected.

15. The radio frequency coil array as set forth in claim 14 wherein the first and second electrically conductive connecting elements cross and are electrically connected adjacent mid-points thereof.

16. The radio frequency coil array as set forth in claim 15 further including:
    a thirteenth capacitor, electrically connected along the first electrically conductive connecting element; and,
    a fourteenth capacitor, electrically connected along the second electrically conductive connecting element.

17. The radio frequency coil array as set forth in claim 13 further including:
    a first half wavelength conductor connected between diagonally opposite points on the first conductor loop, which diagonally opposite points are disposed symmetrically between connection points of the first and second electrically conductive connecting elements;
    a second half wavelength conductor connected between diagonally opposite points on the second conductor loop, which diagonally opposite points are disposed symmetrically between connection points of the first and second electrically conductive connecting elements;
    an adjustable reactance connected between the first and second half wavelength conductors for selectively adjusting mutual inductance between one mode of the first and second radio frequency coils.

18. The radio frequency coil array as set forth in claim 17 further including:
    a first adjustable capacitor connected between first and second segments of the first loop for selectively adjusting mutual inductance of a second mode of the first and second radio frequency coils.

19. The radio frequency coil array as set forth in claim 13 further including:
    a first adjustable capacitor connected between first and second segments of the first loop for selectively adjusting mutual inductance of a second mode of the first and second radio frequency coils.

20. In a radio frequency coil which includes a first electrically conductive connecting element extending between a first pair of symmetric 180° opposite points of the coil, a second electrically conductive element connected between a second pair of symmetric 180° opposite points on the coil, which second pair of 180° opposite points on the coil are substantially 90° offset from the first pair of 180° opposite points, such that the resonance signals from the first and second conductive elements are substantially 90° out-of-phase in a quadrature relationship, the first and second electrically conductive elements being connected via electrical leads with the receiver, a first capacitor electrically connected to the first electrically conductive element, and a second capacitor electrically connected to the second electrically conductive element, leads across the first capacitor being sensitive to a first component of a magnetic field and leads across the second capacitor being sensitive to a second component of the magnetic field, the improvement comprising the radio frequency coil including:
    a third capacitor electrically connected at a first location on the coil between the first and second electrically conductive elements;
    a fourth capacitor electrically connected at a second location on the coil between the first and second electrically conductive elements;
    a fifth capacitor electrically connected at a third location on the coil between the first and second electrically conductive elements;
    a sixth capacitor electrically connected at a fourth location on the coil between the first and second electrically conductive elements, leads across opposite points on the coil being sensitive to a third component of the magnetic field.

21. In the radio frequency coil as set forth in claim 20, the improvement further comprising:
    the first, second, third, fourth, fifth and sixth capacitors being sized relative to each other such that the first, second, and third modes of the coil are mutually orthogonal.

* * * * *